(12) United States Patent
Murayama

(10) Patent No.: US 12,032,856 B2
(45) Date of Patent: Jul. 9, 2024

(54) MEMORY CONTROLLER AND METHOD PERFORMED BY THE MEMORY CONTROLLER

(71) Applicant: CANON KABUSHIKI KAISHA, Tokyo (JP)

(72) Inventor: Kohei Murayama, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/839,968

(22) Filed: Jun. 14, 2022

(65) Prior Publication Data

US 2022/0308799 A1  Sep. 29, 2022

Related U.S. Application Data

(63) Continuation of application No. 16/391,712, filed on Apr. 23, 2019.

(30) Foreign Application Priority Data

May 2, 2018  (JP) ................................. 2018-088862

(51) Int. Cl.
*G06F 12/00* (2006.01)
*G06F 3/06* (2006.01)
(Continued)

(52) U.S. Cl.
CPC .......... *G06F 3/0659* (2013.01); *G06F 3/0611* (2013.01); *G06F 3/0656* (2013.01); *G06F 13/1668* (2013.01); *G11C 7/222* (2013.01)

(58) Field of Classification Search
CPC ..... G06F 3/0659; G06F 3/0611; G06F 3/0656
(Continued)

(56) References Cited

U.S. PATENT DOCUMENTS 6,564,304 B1 * 5/2003 Van Hook ........... G06F 13/1626
710/39
9,208,836 B1 * 12/2015 Ware .................... G11C 7/1012
(Continued)

FOREIGN PATENT DOCUMENTS

JP   H11224221 A   8/1999
JP   2002342159 A  11/2002
(Continued)

OTHER PUBLICATIONS

Office Action issued in U.S. Appl. No. 16/391,712 dated Feb. 24, 2021.
(Continued)

*Primary Examiner* — Mohamed M Gebril
(74) *Attorney, Agent, or Firm* — ROSSI, KIMMS & McDOWELL LLP

(57) ABSTRACT

A memory controller is capable of issuing a first write command for writing data of a predetermined size in a DRAM, and a second write command for writing data of a size smaller than the predetermined size in the DRAM. The memory controller comprises a receiving unit configured to receive a request to the DRAM from a bus; a determining unit configured to determine whether a command that is after the second write command when a reception sequence of a request is observed is issuable in a period until the second write command is issued after a preceding command is issued; and an issuing unit configured to issue a command determined to be issuable before the second write command.

10 Claims, 7 Drawing Sheets

(51) Int. Cl.
*G06F 13/16* (2006.01)
*G11C 7/22* (2006.01)

(58) Field of Classification Search
USPC .................................................. 711/101, 105
See application file for complete search history.

(56) References Cited

U.S. PATENT DOCUMENTS

| | | | |
|---|---|---|---|
| 9,588,840 B2* | 3/2017 | Chung | G06F 11/1048 |
| 10,445,176 B2* | 10/2019 | Lee | G06F 11/1048 |
| 2002/0174292 A1 | 11/2002 | Morita | |
| 2005/0273566 A1* | 12/2005 | Murayama | G06F 13/1694 |
| | | | 711/170 |
| 2008/0104340 A1* | 5/2008 | Shih | G06F 13/161 |
| | | | 711/154 |
| 2009/0100206 A1* | 4/2009 | Wang | G06F 13/1673 |
| | | | 710/112 |
| 2010/0174955 A1* | 7/2010 | Carnevale | G11C 29/16 |
| | | | 714/E11.169 |
| 2012/0239873 A1* | 9/2012 | Huang | G06F 13/1626 |
| | | | 711/E12.001 |
| 2013/0322162 A1* | 12/2013 | Lee | G11C 11/1675 |
| | | | 365/158 |
| 2014/0317470 A1* | 10/2014 | Chung | G06F 11/1048 |
| | | | 714/764 |
| 2015/0134989 A1 | 5/2015 | Chun et al. | |
| 2016/0163376 A1* | 6/2016 | Bains | G11C 11/4096 |
| | | | 365/189.05 |
| 2016/0315639 A1* | 10/2016 | Shang | G06F 9/38 |
| 2018/0293133 A1* | 10/2018 | Lee | G06F 11/1048 |
| 2018/0349060 A1* | 12/2018 | Ochiai | G06F 3/0673 |
| 2019/0339906 A1* | 11/2019 | Murayama | G06F 13/1668 |
| 2020/0135291 A1* | 4/2020 | Takahashi | G11C 8/10 |
| 2021/0064296 A1* | 3/2021 | Ito | G06F 3/0679 |

FOREIGN PATENT DOCUMENTS

| | | |
|---|---|---|
| JP | 2005182538 A | 7/2005 |
| JP | 2009064360 A | 3/2009 |
| JP | 2014154119 A | 8/2014 |
| JP | 2017097618 A | 6/2017 |
| WO | 2015073613 A1 | 5/2015 |

OTHER PUBLICATIONS

Office Action issued in U.S. Appl. No. 16/391,712 dated Oct. 22, 2021.

Notice of Allowance issued in U.S. Appl. No. 16/391,712 dated Mar. 16, 2022.

* cited by examiner

FIG. 6A
FIG. 6B
FIG. 6C
FIG. 6D

MEMORY CONTROLLER AND METHOD PERFORMED BY THE MEMORY CONTROLLER

BACKGROUND OF THE INVENTION

Field of the Invention

The present invention relates to a memory controller and a method performed by the memory controller.

Description of the Related Art

LPDDR4, which is a DRAM standard established in recent years, a Masked Write (MWR) command is introduced. When a DRAM receives an MWR command, the DRAM executes a read-modify-write inside the device. Once the memory reads data, it updates the read data on the basis of a data mask signal, and writes back all the updated data. With this command, the data mask control that has been controlled in a unit of byte in the related art is controlled in a burst write unit, and the implementation is simplified, thus achieving downsizing and reduction in power consumption. When the memory receives the same Write (WR) command as that of conventional DRAMs, the memory executes writing assuming that all the data is effective, and as such the read-modify-write is not internally executed.

When a DRAM device receives an MWR command, the DRAM device internally executes the read-modify-write, and as such, a given interval (tCCDMW) is required to be interposed in a case that, after a preceding WR/MWR command is issued, an MWR command is issued to the same bank. The tCCDMW is 32 (DRAM clock cycle; hereinafter referred to simply as cycle) when the burst length of a burst write to the DRAM is 16, and the tCCDMW is 64 cycles when the burst length is 32. On the other hand, when a WR command is issued after a WR/MWR command is issued, a given interval (tCCD) which is different from the tCCDMW is required to be interposed. The tCCD is 8 cycles when the burst length of a burst write to the DRAM is 16, and is 16 cycles when the burst length is 32. Consequently, when an MWR command is issued to the same bank after a preceding WR/MWR command is issued, an interval four times longer than that of the conventional WR command is required to be interposed.

For the purpose of suppressing generation of such a read-modify-write, Japanese Patent Laid-Open No. 2005-182538 discloses a method in which dummy data is provided to a transfer smaller than a predetermined writing size such that the writing size is set to a predetermined size.

SUMMARY OF THE INVENTION

In the method disclosed in Japanese Patent Laid-Open No. 2005-182538, however, the provision of dummy data can result in inconveniences such as unintended overwriting and increased transfer data amount.

An aspect of the present invention provides a technique that can reduce the influence of the penalty in transfer of data smaller than a predetermined size, and can suppress or eliminate reduction of the memory access efficiency.

An aspect of the present invention includes the following configurations.

A memory controller capable of issuing a first write command for writing data of a predetermined size in a DRAM, and a second write command for writing data of a size smaller than the predetermined size in the DRAM, the memory controller comprising: a receiving unit configured to receive a request to the DRAM from a bus; a determining unit configured to determine whether a command that is after the second write command when a reception sequence of a request is observed is issuable in a period until the second write command is issued after a preceding command is issued; and an issuing unit configured to issue a command determined to be issuable before the second write command.

According to an aspect of the present invention, the influence of the penalty in transfer of data smaller than a predetermined size can be reduced, and reduction of the memory access efficiency can be suppressed or eliminated.

Further features of the present invention will become apparent from the following description of exemplary embodiments with reference to the attached drawings.

BRIEF DESCRIPTION OF THE DRAWINGS

The accompanying drawings, which are incorporated in and constitute a part of the specification, illustrate embodiments of the invention, and together with the description, serve to explain the principles of the invention.

FIGS. 6A to 6D are schematic timing diagrams illustrating other exemplary sequences of DRAM commands output by the memory controller 202 illustrated in FIG. 2.

DESCRIPTION OF THE EMBODIMENTS

Figure 1:
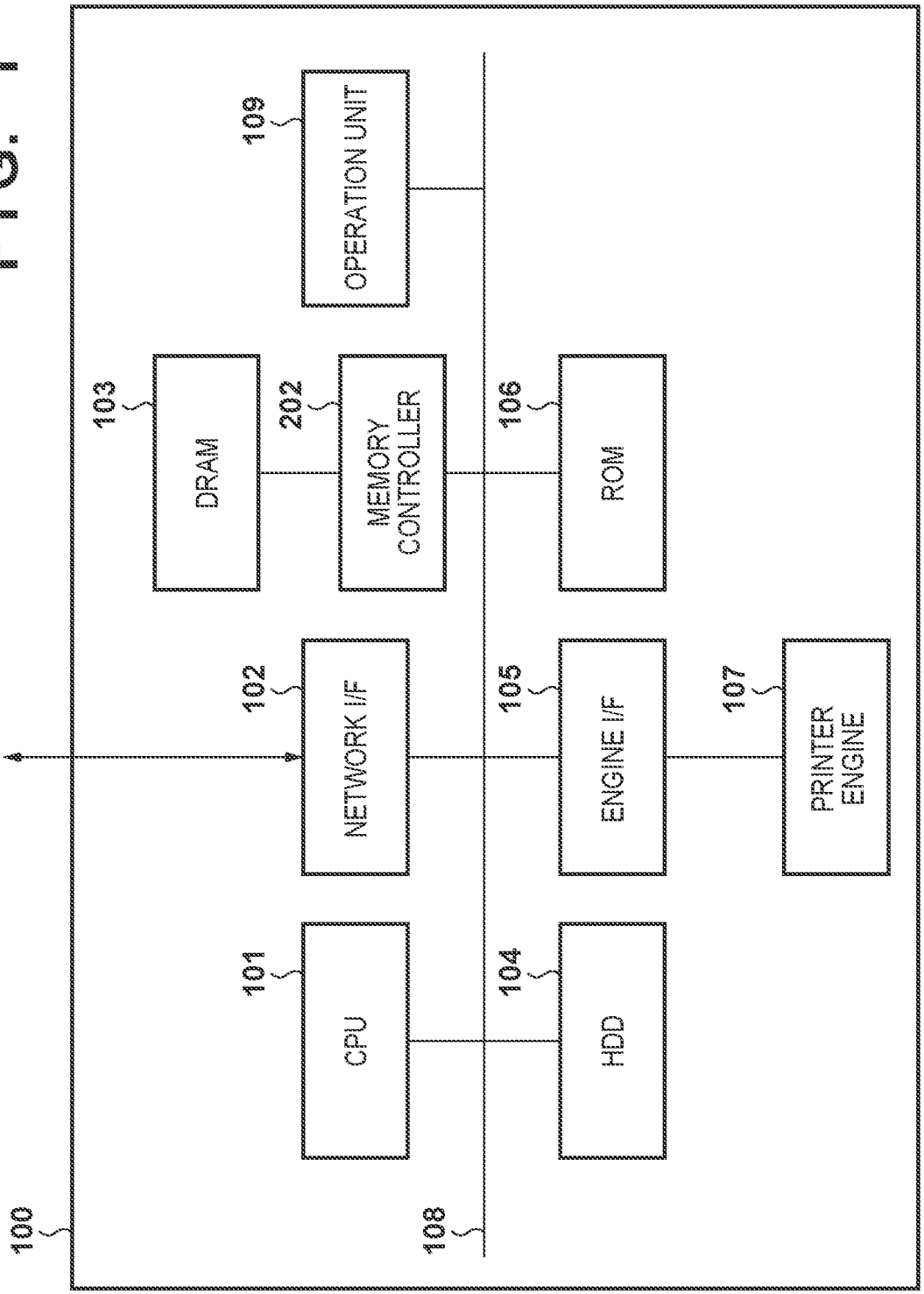
FIG. 1 illustrates a hardware configuration of printer including a memory controller according to an embodiment.

When stream data and/or image processing in which an image is stored in a DRAM as primary storage to perform a process is handled, it is difficult for conventional methods to perform writing in the DRAM in a predetermined writing size. For example, an image with three color elements such as RGB in which each color is represented by 16 bits is handled as data of 6 bytes per pixel. In a case where such an image is handled in units of 16 pixels and is written into a DRAM, a single writing is 96 bytes. In a case where writing is performed by LPDDR4 of 32 bit width with a burst length of a DRAM set to 16, the DRAM is accessed in units of 64 bytes. In this case, pixel data writing in units of 16 pixel essentially requires an MWR command. Since the data is image data here, when dummy data is given to perform writing in units of 64 bytes as disclosed in Japanese Patent Laid-Open No. 2005-182538, pixels on which writing have already been performed might be overwritten depending on the writing sequence. In general, in image processing, burst writing for chunks of data is performed. In this case, the data amount of the end of an image tends to be fractions, and consequently a large number of MWR commands are generated at the end. In addition, the length of a stream of compressed data and the like is indeterminate, and it is therefore expected that the final transfer of a series of stream is fractions. Typically, processing of an image and processing of stream data entail a relatively large DRAM transfer amount. When a large number of MWR commands are generated in such data processing with a large transfer amount, the penalty of tCCDMW is generated each time when the MWR command is generated, and consequently reduction in memory access efficiency can result. An object of the embodiment is to reduce the influence of the penalty in generation of an MWR command, and to suppress reduction in memory access efficiency.

Hereinafter, the same or equivalent components, members, and processes illustrated in the drawings are denoted by the same reference numerals, and a repetitive description thereof will be omitted. Further, a part of the members that are not important in description in each drawing are omitted.

In the embodiment, when a final DRAM command is an MWR command in a burst writing transfer achieved by a plurality of DRAM commands, a command that can be issued in the penalty period of the MWR command is issued before the MWR command. To be more specific, when address alignment is determined in a burst writing transfer of a bus access to a DRAM and a final transfer is a DRAM transfer by an MWR command, the final transfer is separated. A succeeding command that can be issued in the penalty of the MWR command is issued before the MWR command. With this configuration, by dividing a series of burst writing transfer and by rearranging them such that the penalty of the transfer by the MWR command is covered up, the transfer efficiency of the DRAM access can be increased.

Embodiment

FIG. 1 illustrates a hardware configuration of a printer 100 including a memory controller 202 according to the embodiment. The printer 100 is a copier, a multifunctional device or the like, for example. Note that, in the following description, the memory controller 202 according to the embodiment is mounted in the printer 100. However, with the disclosure of the present specification, a person skilled in the art naturally understands that the memory controller 202 is widely applicable to electronic apparatuses including an image capturing device such as a digital camera and a mobile terminal such as a smartphone.

The printer 100 includes a CPU 101, a network I/F 102, a DRAM 103, an HDD 104, an engine I/F 105, a ROM 106, a printer engine 107, a system bus 108, an operation unit 109, and the memory controller 202.

The CPU 101 controls each unit of the printer 100 via the system bus 108. The CPU 101 performs functions (software configurations) and processes of the printer 100 by executing a program stored in the HDD 104, for example. The CPU 101 functions as a bus master that manages or controls data exchange between members via the system bus 108. Alternatively, as another embodiment, a member other than the CPU 101 may have a function of a bus master, or a member having a function of a bus master may be additionally provided.

The DRAM 103 is a memory of a synchronization type, or specifically a volatile memory of a synchronization type, or more specifically, an SDRAM, which is used as a temporary storage region and a work memory in a printing operation of the printer 100. The memory controller 202 is an interface that controls the access to the DRAM 103. The configurations and operations of the memory controller 202 are described later. The HDD 104 is a high-capacity storage, and stores various control programs to be executed by the CPU 101. The HDD 104 is also used as a temporary storage region of processed data, a storage region of accumulated printing data and/or the like. The ROM 106 is a storage in which an activation process program of the printer 100 and the like are stored.

The network I/F 102 is an interface for communicating with another device such as a host terminal (host computer) via an external network. The engine I/F 105 communicates with the printer engine 107 and controls the printer engine 107. The printer engine 107 performs a process of printing an image onto a recording medium such as a sheet by using, for example, an electrophotography technique, an ink-jet image formation technique and/or the like, and performs a finishing process (e.g. stapling process).

The operation unit 109 is a user interface capable of displaying a status of the printer 100, and receiving an input of an instruction from a user for the printer 100. The operation unit 109 includes a preview screen for confirming the printing content in advance, and images of each page of the printing object, and details of the printing such as the number of copies and the number of pages are displayed on the preview screen, for example. The preview screen may be provided with a touch panel and the like such that an instruction can be input by a user, for example.

Figure 2:
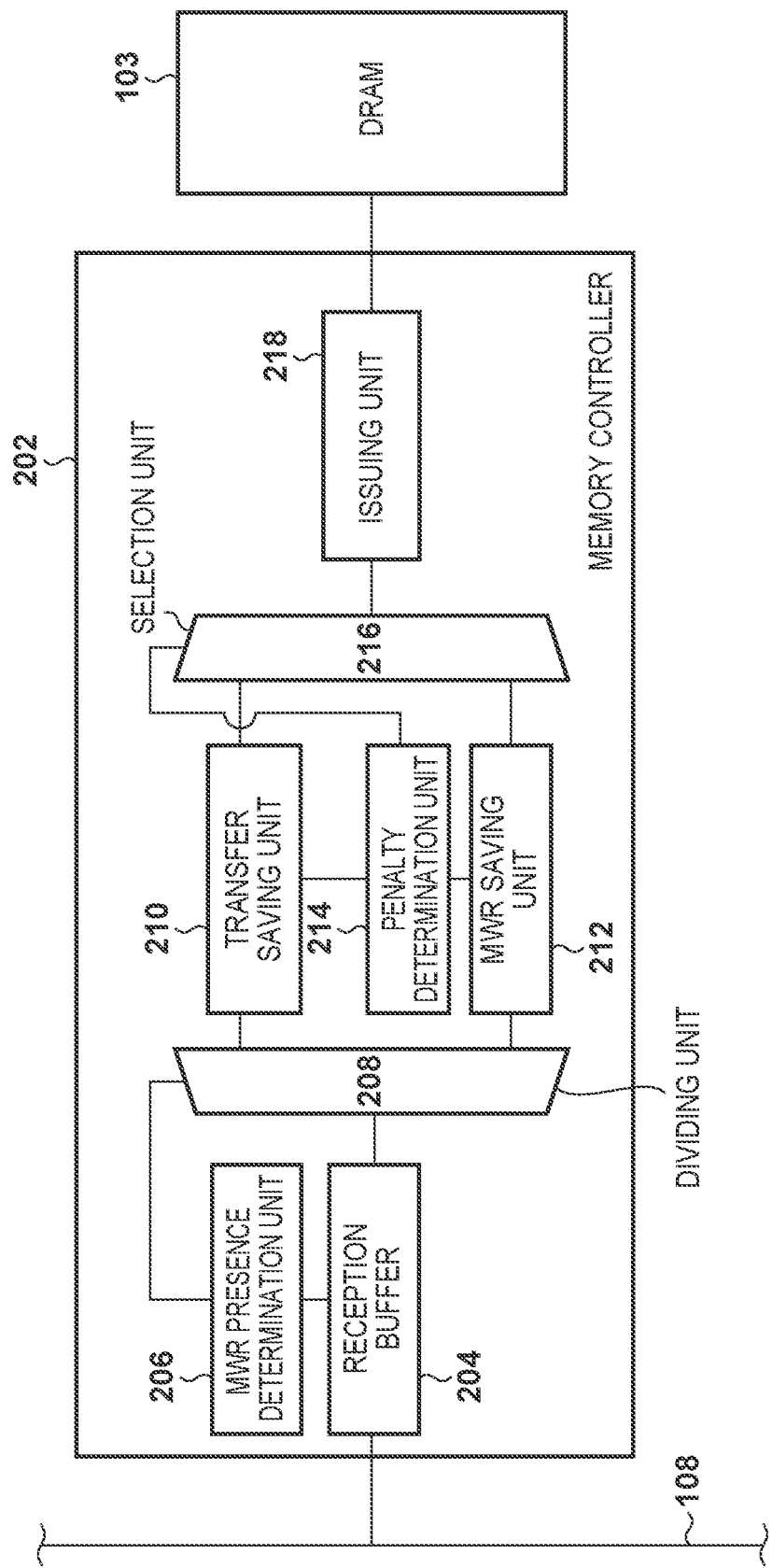
FIG. 2 is a block diagram illustrating a function and a configuration of the memory controller illustrated in FIG. 1.

FIG. 2 is a block diagram illustrating a function and a configuration of the memory controller 202 illustrated in FIG. 1. The memory controller 202 is electrically connected with the DRAM 103. The memory controller 202 and the DRAM 103 may be provided in respective separate semiconductor chips, or may be provided in one semiconductor chip. Alternatively, the DRAM 103 may be a plurality of memory devices that are provided in respective separate semiconductor chips.

The DRAM 103 includes a plurality of banks, various decoders, an input/output sensing amplifier, and a data bus buffer. In each bank, DRAM cells, which are memory elements, are disposed in a matrix. The DRAM 103 may be a publicly known DRAM memory device. In particular, the DRAM 103 may be an SDRAM memory device. In the present embodiment, the DRAM 103 is configured to comply with LPDDR4.

The memory controller 202 controls the DRAM 103 by providing a command (DRAM command) and an address to the DRAM 103. The memory controller 202 transmits writing data to the DRAM 103, and receives read data from the DRAM 103. The memory controller 202 and the DRAM 103 operate in synchronization with a common clock signal supplied from the system bus 108. In the following description, for the sake of convenience, a function of issuing a command of the memory controller 202 is mainly described, and descriptions for other functions of the memory controller 202 such as the function of controlling the data line (DQ) and/or the data strobe line (DQS) are omitted.

In regard to the commands for writing data in the DRAM 103, the memory controller 202 is configured to be capable of issuing a first write command for writing data of a predetermined size in the DRAM 103, and a second write command for writing data of a size smaller than the predetermined size in the DRAM.

The first write command is a WR command (Write command) defined by LPDDR4, for example. The predetermined size, which is an access unit to the DRAM 103, is determined based on at least one of the DRAM burst length and the bit width of the DRAM 103, and is, specifically, the bit width×the DRAM burst length. The minimum interval between commands (tCCD: minimum Column to Column command Delay) set in the DRAM 103 is represented by a DRAM clock cycle count for waiting from a write or read command until the next write or read command. For example, the tCCD is half of the DRAM burst length. The minimum interval (hereinafter referred to also as the penalty of the WR command) between a certain command and the next WR command is the tCCD.

The second write command is an MWR command (Masked Write command) defined by LPDDR4, for example. The minimum value of the length of the period for waiting until an MWR command to a certain bank is issued after a preceding WR command or MWR command to the same bank is issued (or, the minimum interval between a WR command/MWR command and an MWR command to the same bank) is referred to as a penalty tCCDMW of the MWR command. The penalty tCCDMW of the MWR command is set to a value longer than the tCCD. For example, when LPDDR4 is adopted, the penalty tCCDMW of the MWR command is set to a value that is more than twice of the DRAM burst length, that is, four times that of the tCCD. Alternatively, the penalty tCCDMW of the MWR command may be set to a value that is two times, three times, five times, or more generally, N times (N is a natural number equal to or greater than 2) that of the tCCD.

The memory controller 202 determines whether the size of the final transfer of the burst writing transfer matches the access unit to the DRAM 103 on the basis of the burst length and the start address of the burst writing access received from the system bus 108. When they do not match, the memory controller 202 divides the burst writing transfer into a transfer corresponding to the final command and a preceding transfer other than the transfer corresponding to the final command. At the time of the transfer corresponding to the final command, the memory controller 202 determines the presence/absence of a succeeding transfer command that can be issued in an overhead period (penalty) by an issue of an MWR command. When there is a succeeding transfer command that can be issued, the memory controller 202 issues that succeeding transfer command before the MWR command.

The memory controller 202 includes a reception buffer 204, an MWR presence determination unit 206, a dividing unit 208, a transfer saving unit 210, an MWR saving unit 212, a penalty determination unit 214, a selection unit 216, and an issuing unit 218.

The reception buffer 204 receives, from the system bus 108, requests such as a writing request and a reading request to the DRAM 103, and temporarily holds the requests. The reception buffer 204 receives, from a bus master via the system bus 108, a writing request of data to the DRAM 103.

Under the control of the MWR presence determination unit 206, the dividing unit 208 divides the data corresponding to the writing request held by the reception buffer 204, or passes the data to the transfer saving unit 210 or the MWR saving unit 212 without dividing the data.

On the basis of the access unit to the DRAM 103, the MWR presence determination unit 206 determines whether an MWR command is to be generated in writing of the data corresponding to the writing request received by the reception buffer 204 in the DRAM 103. The MWR presence determination unit 206 extracts transfer direction information, burst length information, transfer size information and address information of the writing request held in the reception buffer 204. Also, the MWR presence determination unit 206 has information on the access unit to the DRAM 103, and determines whether the amount of the data that is finally written is the access unit or is smaller than the access unit when the data corresponding to the writing request is written in access units.

When the amount of the data that is finally written is the access unit (i.e. writing of data smaller than the access unit does not occur), the MWR presence determination unit 206 controls the dividing unit 208 such that the data corresponding to the writing request held by the reception buffer 204 is output to the transfer saving unit 210 without changing the data. When the amount of the data that is written at the end is smaller than the access unit, the MWR presence determination unit 206 controls the dividing unit 208 such that the data corresponding to the writing request held by the reception buffer 204 is divided into a portion that is written at the end and another portion. Under the control of the MWR presence determination unit 206, the dividing unit 208 outputs the portion that is written at the end to the MWR saving unit 212, and outputs the other portions to the transfer saving unit 210.

To be more specific, the MWR presence determination unit 206 derives the size of the data corresponding to the writing request from an address obtained by correcting the extracted address of the writing request to an alignment of the access unit to the DRAM 103, the extracted transfer size and the extracted burst length. When a remainder is left when the derived size of the data is divided by the access unit, the MWR presence determination unit 206 determines that the amount of the data that is written at the end is smaller than the access unit. In a case where no remainder is left (an integer multiple of the access unit is obtained) when the derived size of the data is divided by the access unit, the MWR presence determination unit 206 determines that the amount of the data that is written at the end is the access unit. When the size of the data corresponding to the writing request is an integer multiple of the access unit, the size of the final DRAM transfer is the access unit, and when the size of the data corresponding to the writing request is not an integer multiple of the access unit, the remainder is the size of the final DRAM transfer.

The transfer saving unit 210 temporarily stores the data passed from the dividing unit 208. The data that is written into the DRAM 103 by a WR command is stored in the transfer saving unit 210.

The MWR saving unit 212 temporarily stores the data passed from the dividing unit 208. The data that is written into the DRAM 103 by an MRW command is stored in the MWR saving unit 212.

Under the control of the penalty determination unit 214, the selection unit 216 selects one of the data stored in the transfer saving unit 210 and the data stored in the MWR saving unit 212, and passes the selected data to the issuing unit 218.

The penalty determination unit 214 determines whether it is possible to issue, in the period of the penalty of an MWR command to a certain bank, a WR command to another bank that is after the MRW command when the reception sequence of the request is observed. When the data is not stored (or, not saved) in the MWR saving unit 212, the penalty determination unit 214 causes the selection unit 216 to select the transfer saving unit 210. When the data is stored in the MWR saving unit 212, or in other words, in accordance with a determination of the MWR presence determination unit 206 that an MWR command is to be generated, the penalty determination unit 214 determines whether a succeeding WR command can be issued. In accordance with a determination that the command can be issued, the penalty determination unit 214 controls the selection unit 216 such that the data stored in the transfer saving unit 210, not in the MWR saving unit 212, is selected.

The issuing unit 218 controls the timing of a command issue based on a device AC timing of the DRAM 103. The issuing unit 218 generates various commands such as a read command and a write command in accordance with an access protocol to the DRAM 103, and transmits (or, issues) the generated command to the DRAM 103. In particular, the issuing unit 218 issues, before the MWR command, the succeeding WR command that is determined to be issuable by the penalty determination unit 214.

Figure 3:
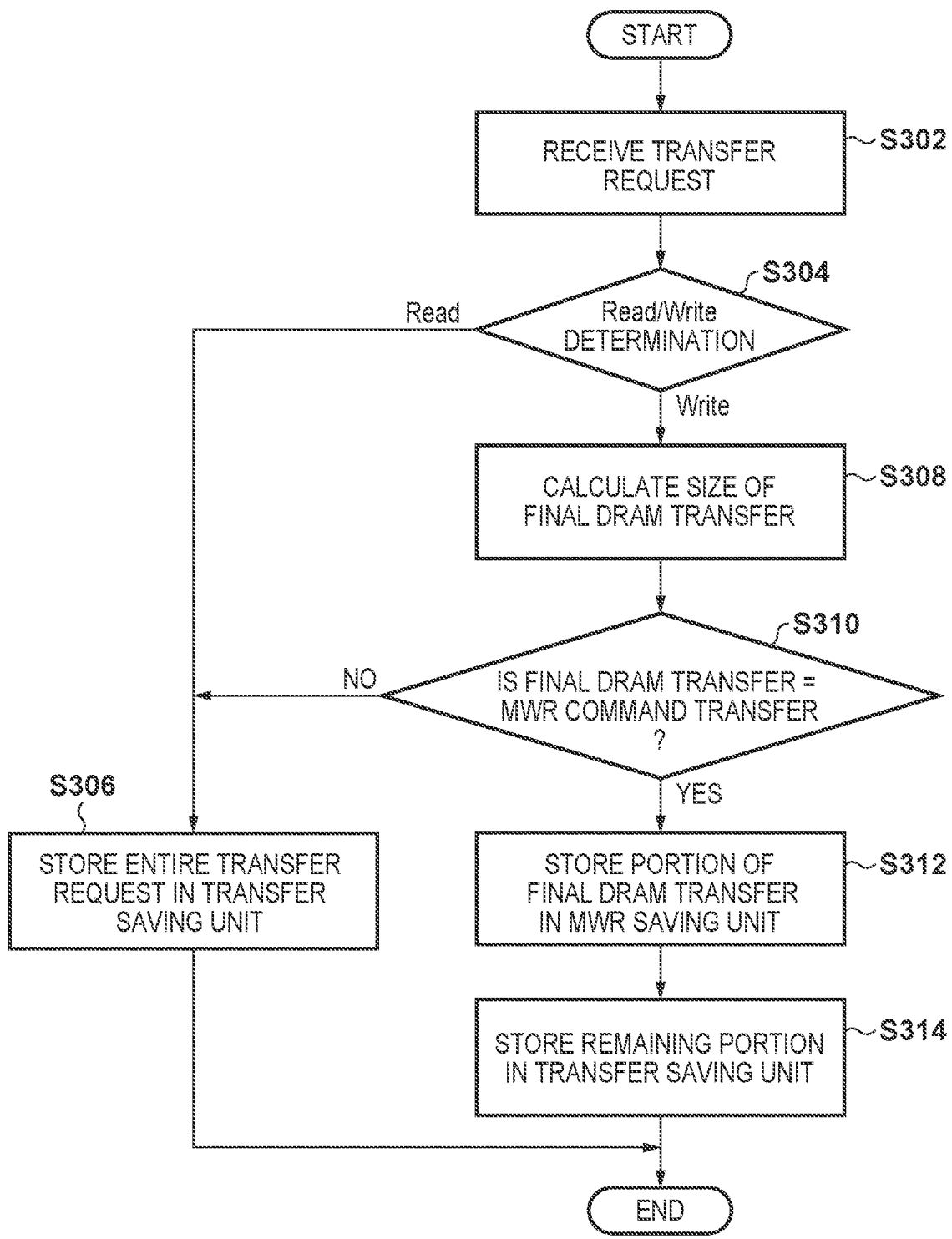
FIG. 3 is a flowchart illustrating a flow of a series of processes of determining presence/absence of generation of an MWR command in the memory controller.

FIG. 3 is a flowchart illustrating a flow of a series of processes of determining presence/absence of generation of an MWR command in the memory controller 202. The memory controller 202 receives a data transfer request from the bus master via the system bus 108, and stores the request in the reception buffer 204 (S302). The MWR presence determination unit 206 determines whether the received transfer request is a reading request or a writing request (S304). In accordance with a determination at step S304 that the request is a reading request, the MWR presence determination unit 206 controls the dividing unit 208 such that the entire reading request is stored in the transfer saving unit 210 (S306). In accordance with a determination at step S304 that the request is a writing request, the MWR presence determination unit 206 calculates the size of the final DRAM transfer of the writing request (S308).

The MWR presence determination unit 206 determines whether the final DRAM transfer is a transfer by an MWR command on the basis of the calculated size of the final DRAM transfer and the access unit to the DRAM 103 (S310). At step S310, the MWR presence determination unit 206 determines whether the calculated size of the final DRAM transfer is the access unit to the DRAM 103 or is smaller than the access unit. Here, when the calculated size of the final DRAM transfer is not the access unit, the MWR presence determination unit 206 determines that the final DRAM transfer is a transfer smaller than the access unit, and accordingly determines that the final DRAM transfer is a transfer by an MWR command. When the calculated size of the final DRAM transfer is the access unit, the MWR presence determination unit 206 further refers to the ByteEnable of the received writing request. When a disabled Byte lane is present in the ByteEnable, the MWR presence determination unit 206 determines that the final DRAM transfer is a transfer smaller than the access unit, and accordingly determines that the final DRAM transfer is a transfer by an MWR command. When no disabled Byte lane is present in the ByteEnable, the MWR presence determination unit 206 determines that the final DRAM transfer is a transfer in the access unit, and accordingly determines that the final DRAM transfer is a transfer by a WR command.

In accordance with a determination at step S310 that the final DRAM transfer is a transfer by a WR command, the MWR presence determination unit 206 controls the dividing unit 208 such that the entire writing request held in the reception buffer 204 is stored in the transfer saving unit 210 (S306). In accordance with a determination at step S310 that the final DRAM transfer is a transfer by an MWR command, the MWR presence determination unit 206 controls the dividing unit 208 such that the data corresponding to the writing request held in the reception buffer 204 is divided into a portion that is written by the final DRAM transfer and the remaining portion excluding that portion. The MWR presence determination unit 206 controls the dividing unit 208 such that a portion that is written by the final DRAM transfer is stored in the MWR saving unit 212 (S312), and controls the dividing unit 208 such that the remaining portion is stored in the transfer saving unit 210 (S314).

Figure 4:
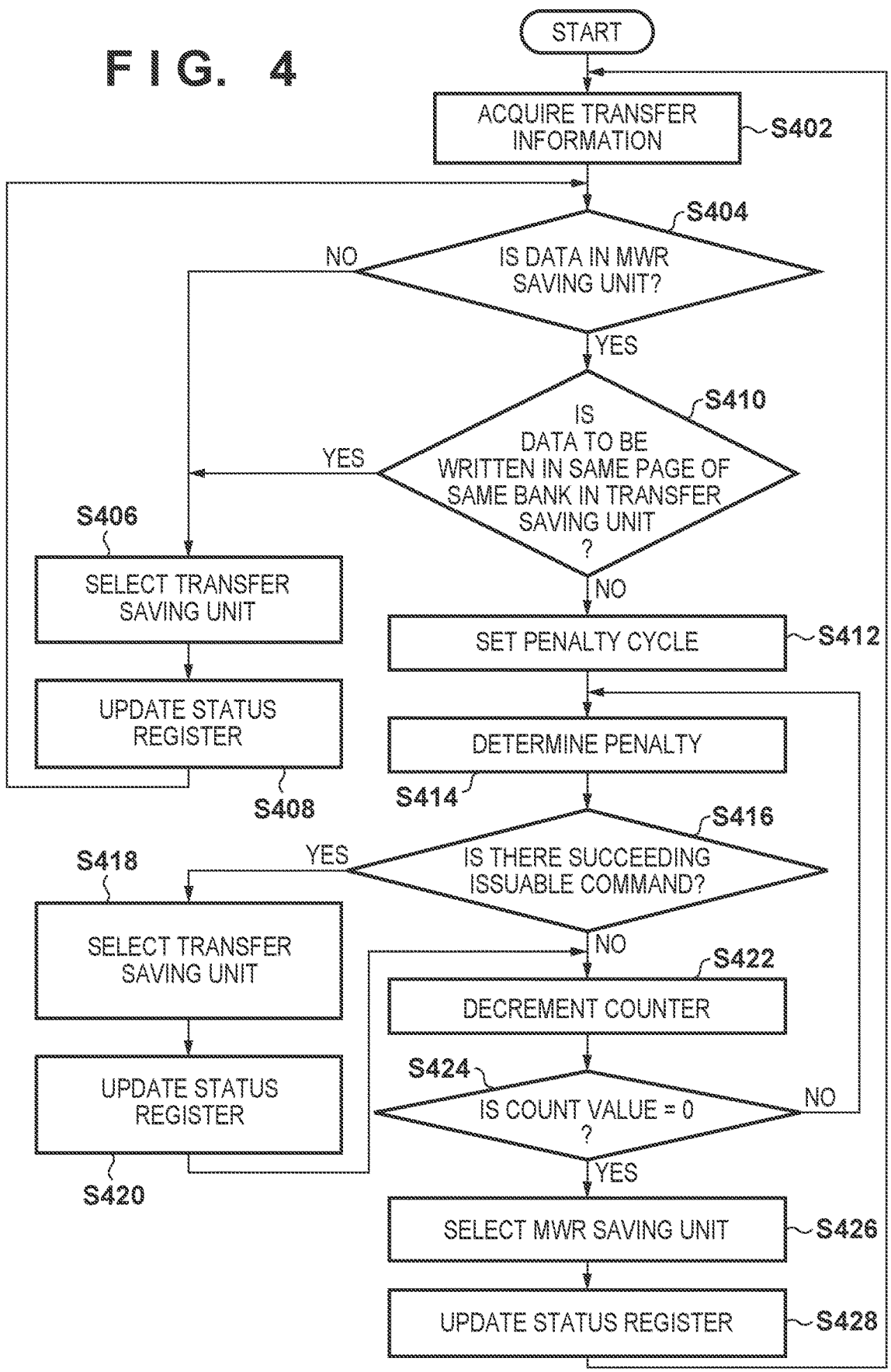
FIG. 4 is a flowchart illustrating a flow of a series of processes of issuing a command in the memory controller.

FIG. 4 is a flowchart illustrating a flow of a series of processes of issuing a command in the memory controller 202. As described above, reading requests and data that is written into the DRAM 103 by a WR command in access units are stored in the transfer saving unit 210. On the other hand, data smaller than the access unit that is written into the DRAM 103 by an MWR command is stored in the MWR saving unit 212. The outputs of the saving units 210 and 212 are connected with the selection unit 216, and data selected by the selection unit 216 is output to the issuing unit 218. The selection unit 216 is controlled based on a determination result of the penalty determination unit 214, and which of data of the transfer saving unit 210 and data of the MWR saving unit 212 is output is determined based on the determination result.

The penalty determination unit 214 acquires transfer information of the data stored in the transfer saving unit 210 and the MWR saving unit 212 (S402). The transfer information includes the bank address, the ROW address, the transfer direction (reading or writing) of the data stored in the saving units 210 and 212. The penalty determination unit 214 refers to the MWR saving unit 212 to determine the presence/absence of the data stored in the MWR saving unit 212 (S404). When the data is not stored in the MWR saving unit 212 (NO at S404), the penalty determination unit 214 causes the selection unit 216 to select the transfer saving unit 210 (S406). As a result, the issuing unit 218 issues a WR command when data for writing is stored in the transfer saving unit 210, whereas the issuing unit 218 issues a read command when a reading request is held in the transfer saving unit 210. The penalty determination unit 214 updates a status register by the transfer information of the data the transfer saving unit 210 selected at step S406 (S408). The status register holds the status of the page and the bank currently activated in the DRAM 103. When the issuing unit 218 issues a WR command in accordance with step S406, the penalty determination unit 214 updates the status register by the ROW address and the bank address that are targets of the WR command. Thereafter, the process is returned to step S404.

In accordance with a determination at step S404 that the data is stored in the MWR saving unit 212 (YES at S404), the penalty determination unit 214 refers to the transfer saving unit 210 to determine whether, in the transfer saving unit 210, there is data that is written into the same bank and the same page as those of the data stored in the MWR saving unit 212 (S410). In accordance with a determination that there is such data (YES at S410), the penalty determination unit 214 executes step S406 and step S408. Thus, the data that is written into the same bank and the same page is written into the DRAM 103 by the WR command.

Upon completion of output of all the data that is stored in the transfer saving unit 210 and is written into the same bank and the same page as those of the data stored in the MWR saving unit 212 (NO at S410), the penalty determination unit 214 sets a given penalty cycle to the counter (S412). The penalty cycle may be set to a value equal to the length of the penalty of the MWR command (4×tCCD), or a value greater than the length of the penalty of the MWR command.

By executing the penalty determination, the penalty determination unit 214 determines whether there is a succeeding command that can be issued in the penalty period (S414). At step S414, the penalty determination unit 214 classifies the data stored in the transfer saving unit 210 into at least three types described below. (1) Data that is written into the same bank as that of the data stored in the MWR saving unit 212, (2) Data that is written into a bank different from that of the data stored in the MWR saving unit 212, and (3) A reading request.

Regarding the data (1), when a WR command for writing that data is issued, the penalty determination unit 214 determines that the penalty of the MWR command for writing the data stored in the MWR saving unit 212 changes. Accordingly, the penalty determination unit 214 determines that the succeeding WR command according to the data (1) cannot be issued in the penalty period of the MWR command.

Regarding the data (2), the penalty determination unit 214 determines that the penalty of the MWR command for writing the data stored in the MWR saving unit 212 does not change when a WR command for writing the data is issued. The penalty determination unit 214 determines the penalty of the WR command for writing the data (2) on the basis of at least one of the bank that is a target of the WR command and the page that is a target of the WR command. For example, the penalty determination unit 214 refers to the status register, and determines that the penalty of the page transition is the penalty of the WR command when the page that is a target of the WR command is not currently open. The penalty determination unit 214 determines the tCCD to be the penalty of the WR command when the page that is a target of the WR command is currently open.

The penalty determination unit 214 compares the determined penalty of the WR command with the count value of the counter. When the penalty of the WR command is smaller than the count value, the penalty determination unit 214 determines that the WR command can be issued in the penalty period of the MWR command. When the penalty of the WR command is equal to or greater than the count value, the penalty determination unit 214 determines that the WR command cannot be issued in the penalty period of the MWR command.

Further, the penalty determination unit 214 determines, on a read/write basis, the penalty of the command for the data stored in the transfer saving unit 210. The determination in the case of write is performed as described above. Regarding the data (3), the penalty determination unit 214 determines the penalty of a change of the reading/writing direction to be the penalty of the read command. The penalty determination unit 214 compares the determined penalty of the read command with the count value of the counter. When the penalty of the read command is smaller than the count value, the penalty determination unit 214 determines that the read command can be issued in the penalty period of the MWR command. When the penalty of the read command is equal to or greater than the count value, the penalty determination unit 214 determines that the read command cannot be issued in the penalty period of the MWR command. While a case of a transition from write to read is described here, the penalty of a change of the reading/writing direction may be determined to be the penalty of the WR command also in a case of a transition from read to write.

In accordance with a determination that there is no succeeding command that can be issued in the penalty period of the MWR command (NO at S416), the penalty determination unit 214 decrements the counter value of the counter, or in other words, performs a subtraction by 1 (S422).

In accordance with a determination that there is a succeeding command that can be issued in the penalty period of the MWR command (YES at S416), the penalty determination unit 214 causes the selection unit 216 to select the transfer saving unit 210 (S418). As a result, when data that is written into a bank different from that of the data stored in the MWR saving unit 212 is stored in the transfer saving unit 210, a WR command is issued by the issuing unit 218 before the issue of an MWR command. When a reading request is stored in the transfer saving unit 210, a read command is issued by the issuing unit 218 before the issue of an MWR command. The penalty determination unit 214 updates the status register by the transfer information of data of the transfer saving unit 210 selected at step S418 (S420). Thereafter, the process proceeds to step S422.

After the subtraction from the count value at step S422, the penalty determination unit 214 determines whether the count value has reached 0 (S424). When the count value is greater than 0 (NO at S424), the process is returned to step S414, and the penalty determination with a smaller count value is repeated. When the count value has reached 0 (YES at S424), the penalty determination unit 214 causes the selection unit 216 to select the MWR saving unit 212 (S426). As a result, an MWR command for writing the data stored in the MWR saving unit 212 is issued by the issuing unit 218. The penalty determination unit 214 updates the status register by the transfer information of the data of the MWR saving unit 212 selected at step S426 (S428). Thereafter, the process is returned to step S402.

Note that, regarding a plurality of commands corresponding to the data stored in the transfer saving unit 210, the commands can be issued in a sequence different from the reception sequence of the request in some situation (as described later).

Now an operation of the memory controller 202 with the above-mentioned configuration is described.

Figure 5:
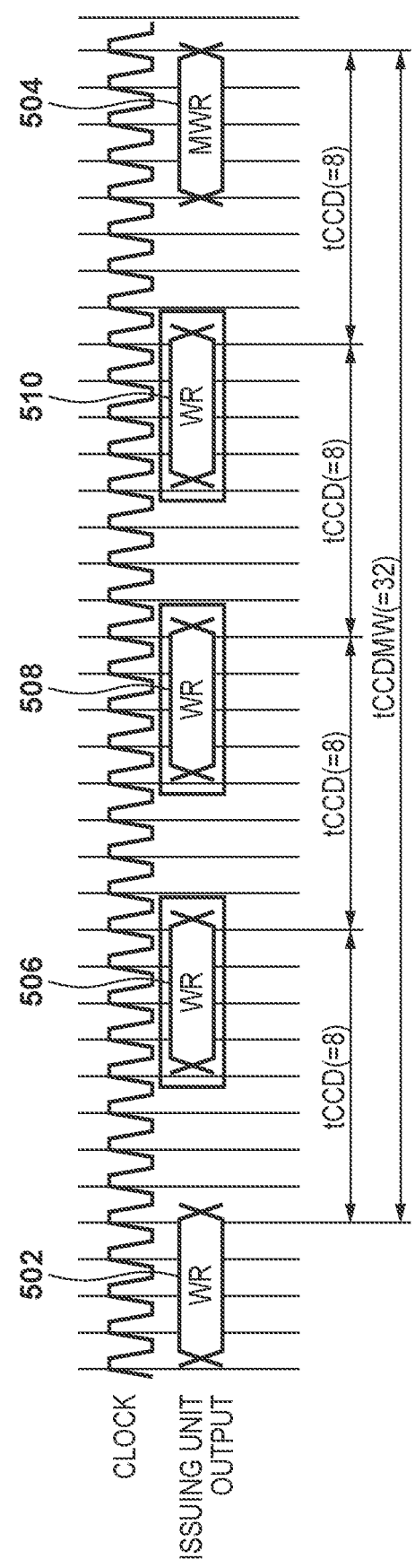
FIG. 5 is an exemplary timing diagram illustrating a sequence of DRAM commands output by the memory controller illustrated in FIG. 2.

FIG. 5 is an exemplary timing diagram illustrating a sequence of a DRAM command output by the memory controller 202 illustrated in FIG. 2. The length of the period between an issue of a WR command 502 to a certain bank of the DRAM 103 and an issue of an MWR command 504 to the same bank is tCCDMW, and in this period, WR commands to other banks 506, 508 and 510 are issued at an interval of tCCD. In this example, tCCDMW=4×tCCD. When the reception sequence of the request is observed, the WR commands 506, 508 and 510 are commands that should be issued after the MWR command 504.

In the example illustrated in FIG. 5, the penalty tCCDMW of the MWR command 504 and the penalty tCCD of the WR commands 506, 508 and 510 are compared with each other, and it is determined that the latter is shorter. As a result, it is determined that the WR commands 506, 508 and 510 can be issued in the penalty period of the MWR command 504, and the WR commands 506, 508 and 510 are issued before the MWR command 504.

Figures 6A, 6B, 6C, 6D:
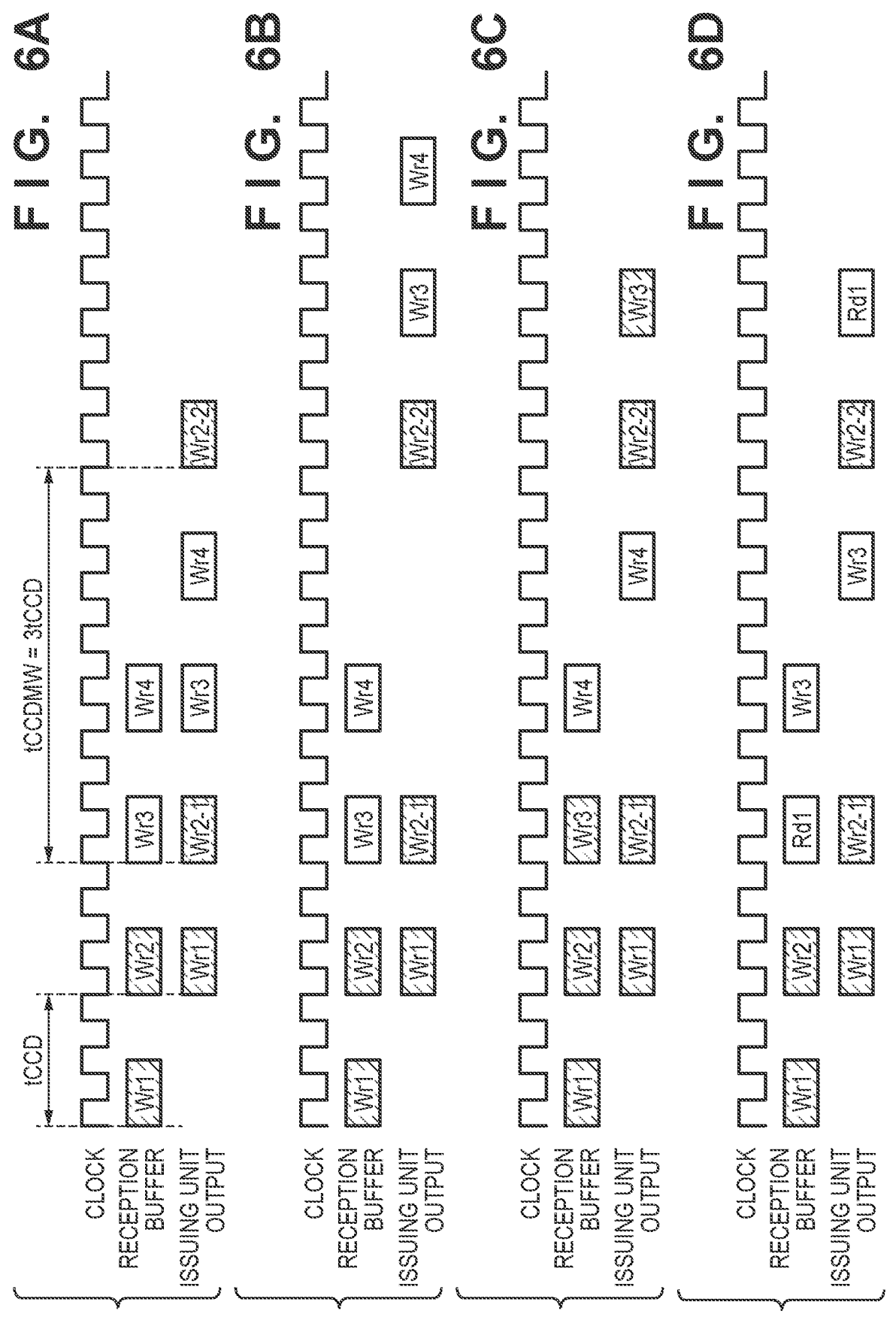

FIGS. 6A to 6D are schematic timing diagrams illustrating other exemplary sequences of a DRAM command output by the memory controller 202 illustrated in FIG. 2. In the examples illustrated in FIGS. 6A to 6D, tCCDMW=3× tCCD. In FIG. 6A, four writing requests (Wr1 to Wr4) are sequentially transmitted at a tCCD interval to the reception buffer 204 from the bus master via the system bus 108, and a write command (WR command or MWR command) is issued in response to the request. Here, the Wr1 and the Wr2 are writings to the same bank (referred to as bank A), and the Wr3 and the Wr4 are writings to a bank B different from the bank A. In addition, the Wr2 is a writing whose final DRAM transfer is smaller than the access unit, and Wr1/Wr3/Wr4 are writings whose final DRAM transfer is the access unit.

In the writing request Wr1, the final DRAM transfer corresponds to the access unit, and is therefore output to the transfer saving unit 210 under the control of the MWR presence determination unit 206. Here, the data to be written is stored only in the transfer saving unit 210, and the data to be written is not stored in the MWR saving unit 212, and accordingly the penalty determination unit 214 controls the selection unit 216 such that the data of the Wr1 is output to the issuing unit 218. The final DRAM transfer of the writing request Wr2 is a writing smaller than the access unit. Accordingly, division into preceding transfer data (Wr2-1) and final DRAM transfer data (Wr2-2) is performed under the control of the MWR presence determination unit 206, and the pieces of data thus divided are stored in the transfer saving unit 210 and the MWR saving unit 212, respectively. The penalty determination unit 214 sets a penalty count (tCCDMW) for the Wr2-2, and starts a subtraction from the counter when the Wr2-1 is output to the issuing unit 218. During the penalty period of the Wr2-2, the succeeding writing requests Wr3 and Wr4 are sequentially input to the reception buffer 204. They are targeted to the bank B, which is different from the bank A that is the target of the Wr1 and Wr2. Each of the writing requests Wr3 and Wr4 is a writing in which the final DRAM transfer corresponds to the access unit, and is therefore output to the transfer saving unit 210. Here, the penalty determination unit 214 calculates the penalty of the writing transfer of Wr3/Wr4. The Wr3/Wr4 is targeted to the same bank B. Here, when the page that is the target of Wr3/Wr4 is managed as already open (PageHit), the penalty is the command interval tCCD and is smaller than the penalty count of the Wr2-2. Accordingly, the pieces of data targeted to the writing of the Wr3 and Wr4 are output to the issuing unit 218 before the data of the Wr2-2.

FIG. 6B is a timing diagram corresponding to a case that the page that is the target of the Wr3/Wr4 is managed as not already open (PageMiss). The penalty of a page process calculated for the Wr3/Wr4 is greater than the penalty count of the Wr2-2. Accordingly, when the penalty count of the Wr2-2 becomes 0, the data of the Wr2-2 is output to the issuing unit 218. By an issue of an MWR command for writing the data of the Wr2-2, the data stored in the MWR saving unit 212 is eliminated, and as a result, data stored in the transfer saving unit 210 is sequentially output to the issuing unit 218 under the control of the penalty determination unit 214.

In FIG. 6C, four writing requests (Wr1 to Wr4) are sequentially transmitted to the reception buffer 204 at a tCCD interval from the bus master via the system bus 108, and a write command (WR command or MWR command) is issued in response to the request. Here, the Wr1, Wr2 and Wr3 are writings to the same bank A, and the Wr4 is a writing to the bank B. In addition, the Wr2 is a writing whose final DRAM transfer is smaller than the access unit, and Wr1/Wr3/Wr4 are writings whose final DRAM transfer is the access unit.

The processes of the Wr1 and Wr2 are identical to those of FIG. 6A. During the penalty period of the Wr2-2, the succeeding writing requests Wr3 and Wr4 are sequentially input to the reception buffer 204. The MWR presence determination unit 206 determines that the final DRAM transfer of the Wr3 is a writing corresponding to the access unit, and controls the dividing unit 208 such that the data of the Wr3 is output to the transfer saving unit 210. The penalty determination unit 214 determines that the penalty of the Wr2-2 is changed since the writing request Wr3 is targeted to the ank A as with the Wr2-2. In this case, the penalty determination unit 214 performs a control such that the data of the Wr3 is not output to the issuing unit 218 before the data of the Wr2-2.

The Wr4 is targeted to the bank B, which is different from the bank A. The MWR presence determination unit 206 determines that the final DRAM transfer of the Wr4 is a writing corresponding to the access unit, and controls the dividing unit 208 such that the data of the Wr4 is output to the transfer saving unit 210. Here, the penalty determination unit 214 calculates the penalty of the writing transfer of the Wr4. When the page that is the target of the Wr4 is managed as already open, the penalty is a command interval tCCD and is smaller than the penalty count of the Wr2-2. Accordingly, the data targeted to writing of the Wr4 is output to the issuing unit 218 before the data of the Wr2-2. Thereafter, when the penalty count of the Wr2-2 becomes 0, the data of the Wr2-2 is output to the issuing unit 218. By the issue of an MWR command for writing the data of the Wr2-2, the data stored in the MWR saving unit 212 is eliminated, and the data of the Wr3 stored in the transfer saving unit 210 is output to the issuing unit 218 under the control of the penalty determination unit 214.

In FIG. 6D, three writing requests (Wr1 to Wr3) and one reading request (Rd1) are transmitted in the order of Wr1, Wr2, Rd1 and Wr4 at a tCCD interval to the reception buffer 204 from the bus master via the system bus 108. Here, the Wr1 and the Wr2 are writings to the same bank A, and the Wr3 is a writing to the bank B. In addition, the Wr2 is a writing in which the final DRAM transfer is smaller than the access unit, and the Wr1/Wr3 are writings in which the final DRAM transfer corresponds to the access unit. The penalty of the reading request (Rd1) for a change of the transfer direction is large. On the other hand, the penalty value calculated for the writing request Wr3 is smaller than the penalty count of the Wr2-2. Accordingly, the issuing unit 218 issues a WR command for writing the data of the Wr3 before the MWR command for writing the data of the Wr2-2. As a result, the WR command for writing the data of the writing request Wr3 is issued before a read command corresponding to the reading request Rd1 received before the writing request WR3.

While the burst length of each request is assumed to be short in the examples illustrated in FIGS. 6A to FIG. 6D, for the sake of convenience, requests in which the burst length is long can also be controlled in the same manner.

According to the memory controller 202 of the present embodiment, the presence/absence of a writing transfer of data smaller than the access unit to the DRAM 103 is detected, and whether a succeeding writing transfer can be issued in the penalty period for that transfer is determined, and, such a succeeding writing transfer is issued when determined to be issuable. Thus, the influence of the penalty for the writing of data smaller than the access unit can be reduced, and reduction of the memory access efficiency can be suppressed, or the memory access efficiency can be increased.

In addition, according to the present embodiment, for the penalty of the MWR command that is generated at an end of stream processing and/or image processing, a DRAM command can be issued during the penalty with a simple configuration, and thus reduction of the memory access efficiency can be suppressed.

Simulation

Simulation results that illustrate the operation and effect of the memory controller 202 according to the embodiment are described below. Conditions for the simulation were as follows.

In compliance with LPDDR4, 3200 Mbps
WL (Write Latency)=14 cycles
BL (Burst Length)=8 cycles
Data Width of the DRAM 103=32 bits
Page of the DRAM 103=2 kilobytes (KByte)
Penalty
   PageMiss (WR→*)=110 cycles
   Penalty of MaskedWrite=16 cycles Under the above-mentioned conditions, a case that two modules conflict in transfer for writing image data of 4000×2000 pixels per horizontal line was simulated. The amount of data of one pixel was 4.5 bytes.

(1) A Case With No Division of Horizontal Line

The head address of each line starts with alignment of a page. There is no interdependence of the page between two modules. In this case, when the two modules are assumed to be simultaneously operating, in one line, the page transition occurs nine times and Masked Write occurs one time. A transfer efficiency of 81.74% was obtained with a conventional method. A transfer efficiency of 81.98% was obtained with the method according to the embodiment, that is, the transfer efficiency was increased by 0.24%. This corresponds to an improvement of 31 MB/s.

(2) A case that Horizontal Line is Divided into Four Parts (Writing in Units of 1000 Pixels)

The head address of each line/divided pixel starts with alignment of a page. There is no interdependence of the page between two modules. In this case, when the two modules are assumed to be simultaneously operating, in one line, the page transition occurs twelve times and Masked Write occurs four times. A transfer efficiency of 61.98% was obtained with a conventional method. A transfer efficiency of 63.09% was obtained with the method according to the embodiment, that is, the transfer efficiency was increased by 2.11%. This corresponds to an improvement of 269 MB/s.

The configuration and the operation of the memory controller 202 according to the embodiment are described above. This embodiment is an example, and it is understood by those skilled in the art that various modifications are possible for each component and combination of processes, and that such modifications are also in the scope of the present invention.

In the embodiment, the access unit and the amount of data of the final DRAM transfer of a received writing request are compared; however, this is not limitative, and the control may also be performed in the same manner for non-final cases.

Figure 7:
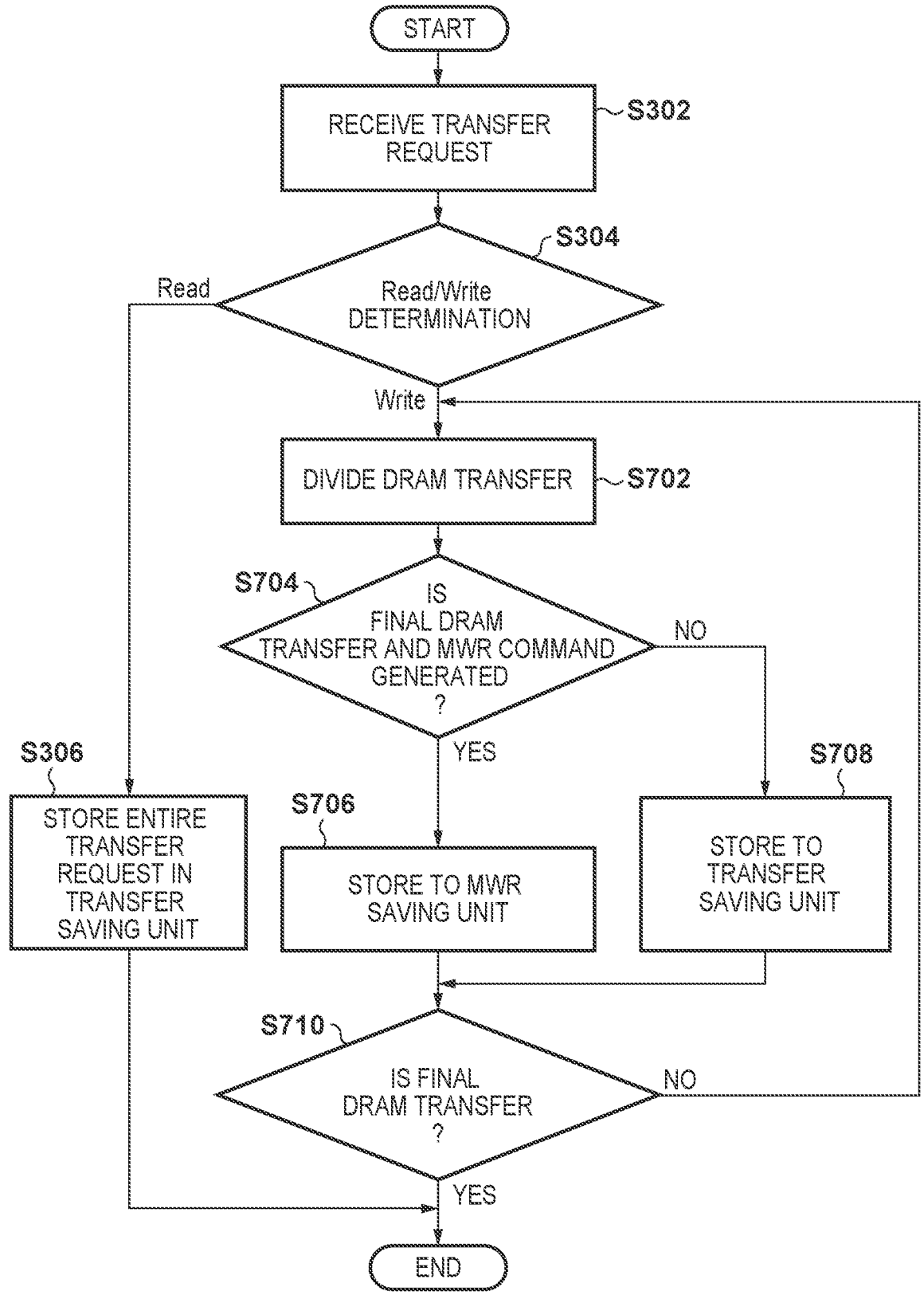
FIG. 7 is a flowchart illustrating a flow of a series of processes of determining presence/absence of generation of an MWR command in a memory controller according to a modification.

In the embodiment, the MWR presence determination unit 206 calculates the size of the final DRAM transfer and the calculated size and the access unit are compared with each other to determine whether the MWR command is to be generated; however, this is not limitative. For example, a process of performing the determination by dividing the writing request by the access unit may be repeated. FIG. 7 is a flowchart illustrating a flow of a series of processes of determining presence/absence of generation of an MWR command in a memory controller according to a modification. When it is determined at step S304 that the request is a writing request, the writing request is divided into the access units to the DRAM 103 (S702). The memory controller determines whether the transfer divided at step S702 is a final DRAM transfer and is smaller than the access unit (S704). In accordance with a determination at step S704 that the transfer is not a final DRAM transfer, or in accordance with a determination that the transfer corresponds to the access unit (NO at S704), the memory controller outputs the divided transfer to the transfer saving unit 210 (S708). On the other hand, in accordance with a determination that the transfer is a final DRAM transfer and is smaller than the access unit (YES at S704), the memory controller outputs the divided transfer to the MWR saving unit 212 (S706). The memory controller determines whether the transfer stored in the transfer saving unit 210 or the MWR saving unit 212 is a final DRAM transfer (S710). When the transfer is not a final DRAM transfer, the division of the DRAM transfer is further performed (S702), and the determination process on the divided transfer is repeated.

In the embodiment, the memory controller 202 has functions for determination, division and selection; however, this is not limitative, and a preceding circuit having such functions may be provided at a stage preceding the conventional memory controller, for example.

In the above-mentioned embodiment, even in a case that it is calculated that the data amount of a final DRAM transfer corresponds to the access unit, it is determined that the data amount of the final DRAM is smaller than the access unit when a disabled Byte lane is present in the ByteEnable, as described for step S310 in FIG. 3. With this configuration, the technical ideas according to the embodiment are applicable to a case that the issued write command differs depending on whether or not a disabled byte is included in the data that is written into a DRAM.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-088862, filed May 2, 2018, which is hereby incorporated by reference herein in its entirety.

What is claimed is:

1. A memory controller having a function of issuing a first write command for writing data of a predetermined size in a first bank of a DRAM, and a second write command for writing data of a size smaller than the predetermined size in the first bank of the DRAM, the memory controller comprising:
   a determining unit configured to determine whether a third write command for writing data to a second bank of the DRAM is issuable in a period until the second write command is issued after the first write command is issued, in a case where the second write command is scheduled to be issued after the first write command is issued and the third write command is scheduled to be issued after the second write command is issued; and
   an issuing unit configured to issue the third write command before the second write command is issued, in a case where the determining unit determines that the third write command is issuable.

2. The memory controller according to claim 1, wherein the predetermined size is determined by at least one of a burst length and a bit width of the DRAM.

3. The memory controller according to claim 1, wherein the period is set such that the period is longer than a minimum interval between commands set for the DRAM.

4. The memory controller according to claim 1, wherein the second write command is a Masked Write command of LPDDR4.

5. The memory controller according to claim 1, wherein penalty period of the second write command is longer than penalty period of the first write command.

6. A method performed by a memory controller, the memory controller having a function of issuing a first write command for writing data of a predetermined size in a first bank of a DRAM, and a second write command for writing data of a size smaller than the predetermined size in the first bank of the DRAM, the method comprising:
- determining whether a third write command for writing data to a second bank of the DRAM is issuable in a period until the second write command is issued after the first write command is issued, in a case where the second write command is scheduled to be issued after the first write command is issued and the third write command is scheduled to be issued after the second write command is issued; and
- issuing the third write command before the second write command is issued, in a case where the determining unit determines that the third write command is issuable.

7. The method according to claim 6, wherein the predetermined size is determined by at least one of a burst length and a bit width of the DRAM.

8. The method according to claim 6, wherein the period is set such that the period is longer than a minimum interval between commands set for the DRAM.

9. The method according to claim 6, wherein the second write command is a Masked Write command of LPDDR4.

10. The method according to claim 6, wherein penalty period of the second write command is longer than penalty period of the first write command.

* * * * *